United States Patent [19]

Marcin, Jr. et al.

[11] Patent Number: 6,103,402
[45] Date of Patent: *Aug. 15, 2000

[54] CRACK FREE METALLIC ARTICLES

[75] Inventors: John Joseph Marcin, Jr., Marlborough; Justin Andreas Neutra, Vernon; David Henry Abbott, Middletown; James Peter Aduskevich, Higganum; Dilip M. Shah, Glastonbury; Dorothea Nadette Carraway, Manchester; Raymond Paul Langevin, West Hartford, all of Conn.; Marc R. Sauerhoefer, Chicopee, Mass.; Richard Alan Stone, Stafford Springs, Conn.

[73] Assignee: United Technologies Corporation, East Hartford, Conn.

[*] Notice: This patent issued on a continued prosecution application filed under 37 CFR 1.53(d), and is subject to the twenty year patent term provisions of 35 U.S.C. 154(a)(2).

[21] Appl. No.: 08/976,239

[22] Filed: Nov. 21, 1997

Related U.S. Application Data

[62] Division of application No. 08/620,589, Mar. 22, 1996, Pat. No. 5,900,170, which is a continuation of application No. 08/432,335, May 1, 1995, abandoned.

[51] Int. Cl.[7] .......................... B32B 15/00; C30B 13/16; B23K 26/34
[52] U.S. Cl. .......................... 428/637; 428/636; 148/404
[58] Field of Search ................................ 428/610, 680, 428/666, 637, 638; 148/404, 903, 512, 562, 565

[56] References Cited

U.S. PATENT DOCUMENTS

| | | | |
|---|---|---|---|
| 4,028,787 | 6/1977 | Cretella et al. | 29/156.8 B |
| 4,122,240 | 10/1978 | Banas et al. | 428/655 |
| 4,232,094 | 11/1980 | Rhodes et al. | 428/614 |
| 4,269,868 | 5/1981 | Livsey | 427/53.1 |
| 4,323,756 | 4/1982 | Brown et al. | 219/121 LF |
| 4,359,352 | 11/1982 | Ray et al. | 148/409 |

(List continued on next page.)

FOREIGN PATENT DOCUMENTS

| | | |
|---|---|---|
| 176942 | 9/1986 | European Pat. Off. . |
| 0435818 | 3/1991 | European Pat. Off. . |
| 0558870 | 8/1993 | European Pat. Off. . |

OTHER PUBLICATIONS

Gary Lewis, Los Alamos National Laboratory, Los Alamos, NM, "Laser Beam Fuses Metal Particles One Layer At A Time", Advanced Materials & Processes, Nov. 1994.

"Rapid Protyping Key To Fast Development", R&D Magazine, May 1994, pp. 55–56.

F. Staub et al., "An Alternative Process For The Manufacture Of Single Crystal Gas Turbine Blades", Sulzer Technical Review, Mar. 1988, pp. 11–16.

"Machining in 3–D", Aviation Week and Space Technology, Jan. 24, 1994, International Product News, vol. 140, No. 4, p. 69.

Schweissen Und Schneiden, vol. 47, No. 3, Mar. 1995, Dusseldorf, DE, pp. 220–223, XP000493794 H, Haferkamp et al.: "3–D–Laserstrahl–Pulver–Auftragschweissen . . . " (translation).

Laser Praxis, No. 2, Oct. 1990, Muchen, DE, pp. LS 101, LS 104–LS106, XP000171951 K. G. Thiemann et al. (translation).

Primary Examiner—John J. Zimmerman
Attorney, Agent, or Firm—John E. Boyd, Esq.; Whitman Breed Abbott & Morgan LLP

[57] ABSTRACT

A containerless method of producing a crack free metallic article of near-net shape includes melting a filler material into a metallic substrate or seed under conditions chosen to preclude cracking. In a preferred embodiment of the invention, a laser beam is operated at a relatively low power density and at a relatively large beam diameter at the substrate surface for an extended length of time to produce a molten pool with a low aspect ratio. Near-net shape is achieved by applying the process in a closed-loop, multi-axis material deposition system.

45 Claims, 8 Drawing Sheets

U.S. PATENT DOCUMENTS

| | | | |
|---|---|---|---|
| 4,382,169 | 5/1983 | Rabkin et al. | 219/76.1 |
| 4,573,516 | 3/1986 | Quested et al. | 164/122.1 |
| 4,644,127 | 2/1987 | La Rocca | 219/121 FS |
| 4,743,733 | 5/1988 | Mehta et al. | 219/121 LF |
| 4,804,815 | 2/1989 | Everett | 219/121.6 |
| 4,878,953 | 11/1989 | Saltzman et al. | 148/4 |
| 4,927,992 | 5/1990 | Whitlow et al. | 219/121.65 |
| 4,940,390 | 7/1990 | Clark et al. | 416/241 R |
| 4,944,817 | 7/1990 | Bourell et al. | 156/62.2 |
| 5,038,014 | 8/1991 | Pratt et al. | 219/121.64 |
| 5,113,582 | 5/1992 | Monson et al. | 29/889.2 |
| 5,135,695 | 8/1992 | Marcus | 264/141 |
| 5,147,999 | 9/1992 | Dekumbis et al. | 219/121.63 |
| 5,160,822 | 11/1992 | Aleshin | 219/121.64 |
| 5,193,272 | 3/1993 | Wortmann et al. | 29/889.1 |
| 5,208,431 | 5/1993 | Uchiyama et al. | 219/121.65 |
| 5,273,204 | 12/1993 | Dalal et al. | 225/166 |
| 5,291,937 | 3/1994 | Corderrman et al. | 164/92.1 |
| 5,304,039 | 4/1994 | Corderman et al. | 148/404 |
| 5,308,409 | 5/1994 | Kamimura et al. | 148/512 |
| 5,312,584 | 5/1994 | Frasier et al. | 419/47 |
| 5,374,319 | 12/1994 | Stueber et al. | 148/404 |
| 5,393,482 | 2/1995 | Benda et al. | 419/1 |
| 5,425,912 | 6/1995 | Smith et al. | 420/447 |
| 5,554,837 | 9/1996 | Goodwater et al. | 219/121.63 |
| 5,673,745 | 10/1997 | Jackson et al. | 164/80 |
| 5,783,318 | 10/1998 | Biondo et al. | 148/512 |

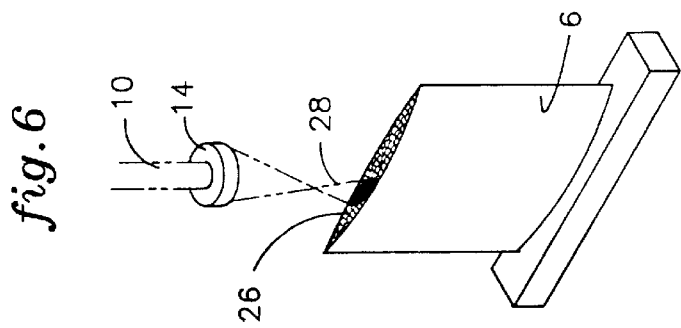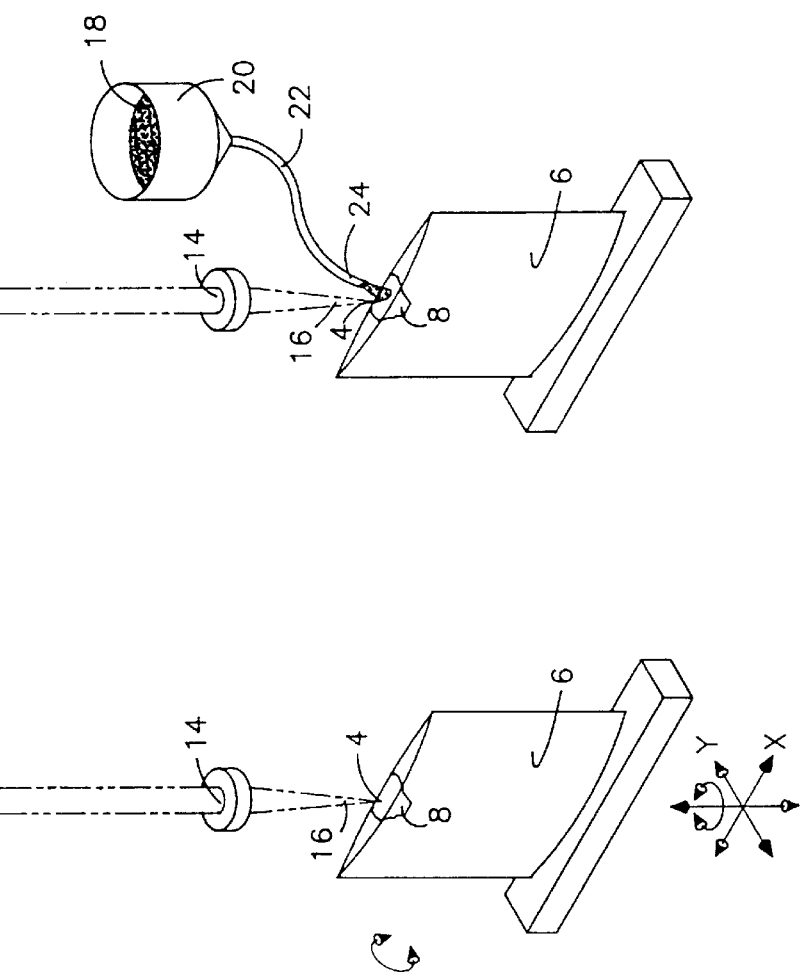

POINT 1

POINT 2

POINT 3

25X

CRACK FREE METALLIC ARTICLES

This is a division of U.S. Ser. No. 08/620,589 filed on Mar. 22, 1996, now U.S. Pat. No. 5,900,170, which is a continuation of U.S. Ser. No. 08/432,335 filed on May 1, 1995 (now abandoned).

This invention shares certain attributes with copending U.S. Ser. No. 08/975,810, entitled, Repair Metallic Articles filed on an even date herewith by the Assignee of the present invention.

TECHNICAL FIELD

The present invention relates generally to a containerless method of producing crack free metallic articles and particularly to a containerless method of producing single crystal gas turbine engine components.

BACKGROUND INFORMATION

Modern gas turbine engines operate at high rotational speeds and high temperatures for increased performance and efficiency. Thus, the materials from which gas turbine engine components are made of must be able to withstand this severe operating environment.

Most high temperature gas turbine engine components are made of nickel base superalloys which are alloys specifically developed for high temperature and high mechanical stress applications. Superalloys are often cast into the component shape. For example, directional solidification is known in the art. This casting technique aligns grain boundaries parallel to the stress axis. This alignment enhances elevated temperature strength. Directional solidification aligns the grains to minimize failure initiation sites because high temperature failure usually occurs at the boundaries between metal crystals.

An extension of the above technique is single crystal casting. Casting of alloys in single crystal form eliminates internal crystal boundaries in the finished component. Single crystal turbine blades and vanes possess superior characteristics such as strength, ductility, and crack resistance at high operation temperatures. Thus, single crystal engine components are extensively used in the turbine section of gas turbine engines. Although single crystal engine components are desirable, they are extremely costly to manufacture and defects often occur during initial manufacturing.

The successful use of conventional containerless laser deposition methods is particularly difficult for producing single crystal components of complex geometry because of inadvertent grain boundary introduction. Most prior art fabrication processes have, to our knowledge, employed finely focused laser beams of high power density to interact with the metal substrate. The result has been cracking due to at least two phenomena. The first phenomena relates to a high rate of solidification. The high rate of solidification results from the high temperature difference between the laser beam created molten pool and the substrate. This temperature difference is a consequence of the rapid heating rate which does not permit the unmelted substrate to achieve any significantly elevated temperature. This means that when the laser beam moves on or is shut off, the melted surface portion will rapidly solidify because the substrate acts as an extremely effective heat sink.

More specifically, the high power densities and short exposure times lead to high thermal gradients and high cooling rates which result in rapid solidification rates. This type of localized melting and solidification can induce thermal stresses during solidification which can lead to cracking.

The second phenomena which leads to cracking and which results from prior art teachings is that the pool is deep and has a high aspect ratio (depth to width). In the solidification of such a relatively narrow deep molten pool, several adverse effects occur. For example the heat flow will be sideways from the pool as well as down into the substrate because of the relatively high ratio of depth to width. As the solidification reaches a conclusion, there will be a high state of stress resulting from the constraint of the pool walls. The net effect of a high ratio is the introduction of high angle grain boundaries and a heavily constrained solidification condition. Introduction of high angle grain boundaries reduces the integrity of the material and increases the susceptibility to cracking. The high constraints of this type of solidification leads to high stresses during and after solidification which can also lead to cracking. Thus, for the previously enumerated reasons, prior art laser metal treatment techniques have been prone to cracking and have generally been difficult to use.

There have been attempts to alleviate some of these problems. These attempts include preheating the substrate to reduce cracking as well as the use of different filler materials, such as filler materials having more ductility and less of a propensity for solidification cracking. Unfortunately, these attempts to solve the problem have been relatively unsuccessful.

Accordingly, there exists a need for a containerless method of producing a crack free metallic article, particularly a single crystal gas turbine engine component.

DISCLOSURE OF INVENTION

According to the present invention, a containerless method of producing a crack free metallic article is disclosed. More specifically, a containerless method of producing a crack free single crystal gas turbine engine component is disclosed.

An aspect of the invention includes melting a filler material into a substrate or seed under conditions chosen to eliminate cracking. In a preferred embodiment of the invention, a laser beam, or other suitable energy source, is operated at a relatively low power density (between about 10 watts/cm$^2$ (10 J/sec-cm$^2$) and about 10$^4$ watts/cm$^2$ (10$^4$ J/sec-cm$^2$)) and at a relatively large diameter (between about 0.1 inches (0.254 cm) and about 4 inches (10 cm)), for an extended length of time (between about 0.1 seconds and about 1000 seconds), to produce a molten pool with an aspect ratio which is relatively low, i.e. a shallow pool.

Material is added to the pool, melts into the pool and solidifies to form a deposit. Alternatively, the material can be applied to the surface before or during melting. Preferably, the material added is powder having substantially the same composition as the substrate. However, depending on the specific application, a material with a different composition than that of the substrate may be desired. For example a corrosion resistant filler material would be desirable when corrosion is a problem and strength is not as important. Depending upon the nature and cause of the defect, the material can be appropriately tailored to reduce the probability that the defect will recur.

Laser beam operation at a relatively low power density and large diameter causes solidification to occur generally from the substrate outward toward the surface in a planar fashion as contrasted with previous techniques in which the solidification front was not controlled.

The present invention solves the problem of cracking during laser metal processing by significantly changing the laser melting parameters. Whereas in the prior art, processes have been performed at high power density over short time periods, according to the present invention, the power density is reduced and the interaction time is increased. This allows for a significant increase in the temperature of the substrate immediately adjacent the molten pool at the time that solidification occurs. By maintaining the substrate adjacent to the molten pool at a relatively high temperature, the thermal gradient and rate of solidification are diminished. This reduced the likelihood of cracking. Thus, the present invention is capable of reducing the thermal gradient, cooling rate, solidification rate, and aspect ratio (depth to width) of the molten pool to produce a single crystal metallic article.

Yet another aspect of the invention includes a first step of melting filler material into the substrate or seed, allowing solidification to occur, and remelting the filler material under conditions chosen to eliminate cracking. Specifically, an energy source melts a portion of the substrate and forms a pool. The power density of the energy source may be between about $5 \times 10^3$ watt/cm$^2$ ($5 \times 10^3$ J/sec-cm$^2$) and about $5 \times 10^6$ watt/cm$^2$ ($5 \times 10^6$ J/sec-cm$^2$), depending upon the heat input requirements of the substrate. Material is then added to the pool, melts into the pool and solidifies to form a deposit. Alternatively, the material can be applied to the surface before-or during melting. The deposit rapidly solidifies upon removal of the energy source as a result of heat conduction into the substrate. The deposit, however, will very likely contain cracks because of stresses during solidification.

The deposit (and the surrounding region) is then remelted using an energy source at a lower power density and for a longer exposure time using the parameters set forth previously for the broad one step embodiment. The energy source heats the substrate, thereby reducing the thermal gradient, the solidification rate, as well as stresses during and after solidification. A crack free deposit with no crystal boundaries results.

The process is repeated, as required, to produce a crack free article of desired geometry. This is possible by applying the process in a closed-loop, controlled, multi-axis material deposition system. Each deposit melts into material beneath each deposit and continues the crystallographic orientation of the substrate or seed upon solidification.

In yet another embodiment of the present invention, several deposits are formed prior to remelting at a lower power density and for a longer time than each pool previously took to form. Remelting is performed with an energy source covering a larger article surface area than was previously covered.

The present invention is capable of producing a crack free, near-net shape single crystal article. As a result, this invention is ideal for producing a single crystal gas turbine engine component without the use of a container, such as a casting mold. It is now possible to effectively produce a single crystal gas turbine engine component without the use of traditional casting technology. This is highly desirable because mold-metal interactions are eliminated, thereby improving the efficiency of the production process.

The present invention also allows deposition of an identical composition to the underlying substrate or seed. Prior art processes have generally compromised the substrate composition, such as with the addition of melt depressants. No compositional compromises are necessary with the present invention. However, intentional compositional changes may be made to improve the performance of the component and to enable the component to better withstand the service environment. For example, if oxidation resistance is desired on a particular portion of the component, the deposited material in that area might be enriched with one or more elements such as Al, Cr, Y, La and Ce. If resistance to hot corrosion is desired, the region might be enriched with Cr. Fabricated regions which are stronger than the underlying seed or substrate can be achieved by increasing the amounts of materials selected from the group consisting of Al, Ti, Ta, Cb, Mo and W. However, if increased ductility is desired, than the above mentioned group of alloying elements should be reduced.

The foregoing and other features and advantages of the present invention will become more apparent from the following description and accompanying drawings.

BRIEF DESCRIPTION OF THE DRAWINGS

FIG. 4 shows an energy source used to create a molten pool.

FIG. 5 shows material being deposited into the molten pool.

FIG. 6 shows an energy source with a large beam diameter at the substrate surface.

BEST MODE FOR CARRYING OUT THE INVENTION

The present invention concerns the melting of a filler material into a substrate or seed under conditions chosen to eliminate cracking. The seed or substrate 6 (shown schematically in FIG. 1–FIG. 6) may be any metallic material. For example, the substrate 6 may be a nickel base, cobalt base, or other superalloy material.

If the substrate 6 or seed is a single crystal metallic article, preferably the <100> crystal orientation is determined by x-ray diffraction. Crystals grown in this direction develop a desirable unidirectional structure. The substrate 6 or seed is positioned such that a [100] direction is vertically orientated. Although determination of the <100> crystal orientation is desirable due to ease of crystal growth in this orientation, it is not essential for the practice of the present invention.

The substrate 6 may be preheated to help reduce stresses which can cause solid state cracking. Preheating may be accomplished by various methods known in the art including a laser beam, an induction heater, a quartz lamp or a standard clam-shell type furnace.

Figure 1:
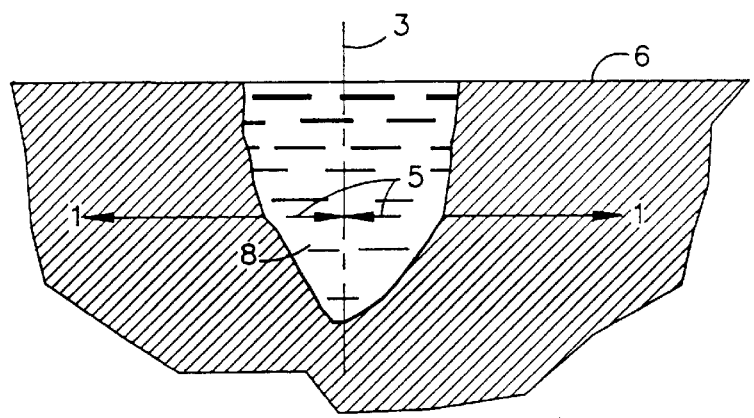
FIG. 1 shows a prior art molten pool.

FIG. 1 is a schematic depiction of a prior art laser deposition process showing a molten pool 8 whose depth is significantly greater than its width. Heat flow is in the direction of arrow 1 and the solidification front moves in the direction of arrow 5. The solidification front moves generally toward the center line 3 of pool 8. Stresses result when the solidification fronts from opposites sides of pool 8 meet at center line 3. This stress is a cause of cracking in many prior art processes.

Figure 2:
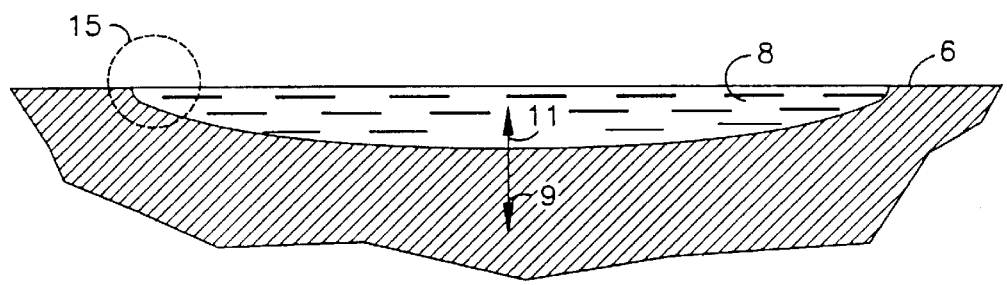
FIG. 2 shows a molten pool of the present invention.

FIG. 2 shows a schematic illustration of the process of the present invention in which the diameter of the pool 8 is substantially greater than the depth of pool 8. Pool 8 solidifies through heat extraction in direction 9 which causes the liquid solid interface to move toward direction 11 which is also toward the surface of substrate 6. This substantially planar front solidification process reduces cracking tendency significantly since the solidification front eventually coincides substantially with the free substrate surface 6. Therefore, there are no residual stresses in the material. Only at the pool edges, denoted as 15, may the solidification front not move directly toward the free surface of substrate 6.

Figure 3:
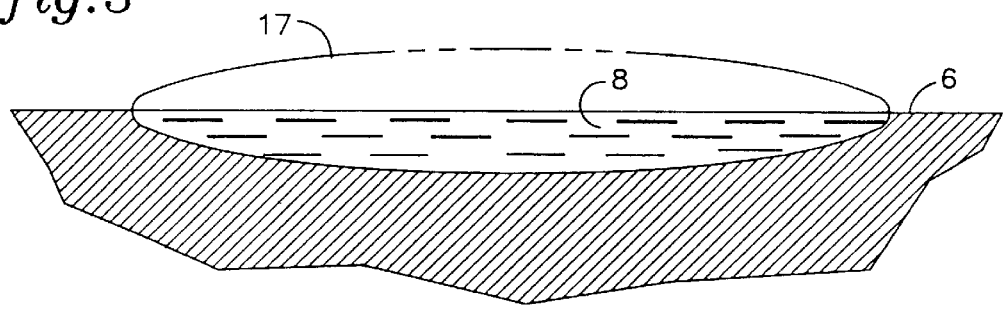
FIG. 3 shows a molten pool of the present invention including a build up of material.

Thus, the present invention provides a method for the surface melting of crack prone metal articles without resulting cracking. The present invention also contemplates that the shallow pool 8 shown in FIG. 2 will be augmented through the addition of extra material, typically in the form of powder, but also possibly in the form of wire or foil, to cause a build up 17 as shown in FIG. 3.

We have found it to be possible to build up the surface of a metal substrate 6 and thereby fabricate a metallic article. Importantly, we have found that when we practice the invention, we can continue the underlying crystal structure without the formation of new grains or grain boundaries during this fabrication process. This is significant because it provides a method for fabricating single crystal articles.

In a preferred embodiment of the present invention, we employ a laser beam, or other suitable energy source, having a power density between about 10 watts/cm$^2$ (10 J/sec-cm$^2$) and 10$^4$ watts/cm$^2$ (10$^4$ J/sec-cm$^2$), and preferably between about 80 watts/cm$^2$ (80 J/sec-cm$^2$) and about 800 watts/cm$^2$ (800 J/sec-cm$^2$) for a time period ranging from about 0.10 seconds and about 1000 seconds and preferably from about 0.5 seconds to about 100 seconds. This in combination with a laser beam, or other suitable energy source, having a diameter of between about 0.1 inches (0.254 cm) and about 4 inches (10 cm) and preferably between about 0.2 inches (0.51 cm) and about 2 inches (51 cm) will permit the formation of the shallow pool geometry illustrated in FIG. 2 and FIG. 3 rather than the deep narrow pool shown in FIG. 1.

In an alternative embodiment of the present invention, and as shown in FIG. 4, a first energy source, in this case a laser, is focused at a spot 4 on the substrate 6 or seed. A laser, such as a YAG pulsed laser, is preferred because of its ability to produce small diameter spot sizes on the surface of the substrate 6 or seed which increase the accuracy of the fabrication process. It is also possible to use a continuous laser beam for the production of "lines" of deposits. The power density of the laser may be between about 5×10$^3$ watts/cm$^2$ (5×10$^3$ J/sec-cm$^2$) and about 5×10$^6$ watts/cm$^2$ (5×10$^6$ J/sec-cm$^2$), depending upon the heat input requirements of the substrate 6. Preferably, the power density is about 10$^5$ watt/cm$^2$ (10$^5$ J/sec-cm$^2$) for a nickel base single crystal substrate.

Preferably, the diameter of the beam spot on the substrate 6 produced by the laser is between about 0.01 inches (0.254 mm) and about 0.100 inches (2.54 mm). Small diameter spot sizes increase the accuracy of the process, large spot sizes increase the rate of build up. Maximum spot size is dependent on available power.

As shown in FIG. 5, beam 10 forms molten pool 8 on substrate 6. Filler material is then deposited into pool 8. Material may be applied before or during beam 10 application. Preferably, the material is powder 18 with substantially the same composition as the substrate 6.

Upon depositing powder 18 in the pool 8, the powder melts and forms a deposit which rapidly solidifies upon removal of beam 10. For example, the beam 10 may be traversed across the substrate 6 thereby removing the heat input. Alternatively, a simultaneous application of powder 18 and beam 10 onto the substrate 6 may be employed for simultaneous melting of powder 18 and substrate 6. A plurality of deposits may be formed in the aforementioned manner. However these deposits will generally be cracked because of stresses associated with rapid solidification.

The deposits are then remelted under conditions chosen to eliminate cracking, namely lower power density and longer exposure time. Specifically, the second energy source may be the same energy source as the first energy source, adjusted at a lower power density. The power density may be between about 10 watts/cm$^2$ (10 J/sec-cm$^2$) and about 10$^4$ watt/cm$^2$ (10$^4$ J/sec-cm$^2$), depending upon the heat input requirements of the substrate 6. Preferably, the power density is about 600 watts/cm$^2$ (600 J/sec-cm$^2$) for a nickel base single crystal substrate. Most preferably, the operating parameters with respect to power density do not overlap. Exposure time for the second energy source may be between about 0.1 seconds to about 1000 seconds, and most preferably between about 0.5 seconds to about 100 seconds. Exposure time for the second energy source is preferably at least about 10 times greater than the exposure time for the first energy source in the production of each pool 8. Most preferably, exposure time is at least about 10$^5$ times greater.

Preferably, the spot diameter of the second energy source at the substrate surface is greater than the first energy source, as shown at 28 on FIG. 6. Most preferably, the spot diameter is at least about 5 times the spot diameter of the first energy source.

Upon removal of the second energy source, the material resolidifies, but at a slower rate than that of the first energy source. This slow solidification reduces the associated shrinkage stresses thereby essentially eliminating the propensity for crack formation. Solidification occurs unidirectionally, from the substrate 6 to the surface, thereby encouraging the continuation of the underlying crystal morphology and discouraging the formation of new grains.

The above steps can be repeated as needed for substrate 6 buildup. Total time for article fabrication is dependent on article size.

As shown in FIG. 6, a solidified area 26 of deposits may be formed. If the solidified area 26 is larger than the spot diameter of the second energy source, the area 26 may be melted by continuously moving an energy source across the deposited structure at a rate which allows the exposed material to melt such that unconstrained and unidirectional solidification is promoted. No over melting occurs which would result in loss of desired cross-section geometry.

Alternatively, the process steps for the creation of each layer may be performed concurrently, such as with the use of multiple energy sources.

Once the desired build up of layers is produced, the surface may be finished. X-ray diffraction of the finished article may be performed to confirm continuation of the crystallographic orientation throughout the layers.

FIG. 5 schematically shows an apparatus suitable for the present invention. As shown in FIG. 5, a powder feed device 20 delivers powder 18 to pool 8. Powder feed device 20 delivers powder 18 through powder feed line 22 to powder feed nozzle 24. The powder feed nozzle 24 may be of a coaxial design to deliver power 18 coaxially around beam 10. Suitable powder flow rates may be between about 0.5 g/min and about 50 g/min, depending upon filler material, beam spot size and power density. Alternatively, the powder 18 may be preplaced on the substrate 6.

Relative motion between the beam 10 and the component may be achieved by manipulation of optical elements or the substrate 6 by mechanical or electrical means. For example, opto-electric elements may be used. The material feed may be directed by non-mechanical means using magnetic or electro-static effects.

In a preferred technique, a three dimension computer model of the article to be fabricated is created, for example, by a CAD system. In the model, incremental layers define individual cross sections of a component to be fabricated. The computer generated model is used by the computer to guide a multi-axis part positioning system, such as a five-axis system, and/or a laser beam. Preferably, the part positioning system is greater than a three-axis system. For example, with a five-axis positioning system, horizontal part features can be constructed by rotating the component to build all features along a vertical axis to counteract the effects of gravity. The component is fabricated one incremental layer at a time as defined by the computer model.

The following examples are presented to further explain the present invention. It should be noted that for the power densities described in the specification, between about 30% and about 35% of the values are absorbed with use of a YAG laser and a nickel base substrate. However, if another laser or substrate is employed, the percent absorbed, as well as the power density, will vary accordingly. In addition, power values noted herein refer to average power.

EXAMPLE 1

A single crystal work piece (substrate) with a [100] crystal orientation and a nominal composition, by weight percent, of 5% Cr, 10% Co, 1.9% Mo, 5.9% W, 3% Re, 8.7% Ta, 5.65% Al, 0.1% Hf, balance Ni was cleaned with alcohol. The work piece was then placed on a platform of a laser deposition apparatus. A YAG pulsed laser with a pulse rate of 90 hertz (90 sec$^{-1}$), power time of about 2 milliseconds, power density of about 10 watts/cm$^2$ (10$^5$ J/sec-cm$^2$) and power of 100 watts (100 J/sec), was focused at the center of the work piece surface.

An Allen-Bradley 7320 NC controller was used to control the laser. As shown in FIG. 5, the laser emitted beam 10 which fell on mirror 12 that deflected the bean 10 toward the work piece. The beam 10 emitted from the laser passed through a lens system 14 arranged between the mirror 12 and the work piece. As the beam 10 emerged from lens system 14, it came to a focal point 16 at about the surface of the work piece.

A spot diameter size of about 0.15 inches (0.381 mm) was produced at the work piece surface. A molten pool 8 was then created. The molten pool 8 was about 0.2 inches (0.508 mm) in diameter with a 0.08 inch (0.203 mm) depth. Each laser pulse created a pool 8 as the beam of the laser moved across the surface of the work piece.

A model 1260 Roto-Feed Control by Miller-Thermal, Inc., Appleton, Wis. was used to control powder flow rate. Disc rotation varied between about 1 rpm and about 1.5 rpm causing a powder flow rate of about 15 g/min. The powder size was about 400 mesh and had the same composition as the work piece. Argon gas at about 20 psi (138 kPa) continuously flowed into the powder feed device 20 to maintain powder under pressure and facilitate powder feed. Argon was also used to provide a shielding environment to avoid work piece contamination.

The powder feed moved in tandem with the laser such that powder landed in the molten pool(s) 8 created by the moving laser, thereby forming a deposited structure which then rapidly solidified.

A deposited structure of eight rows of deposits was created. A space of about 0.1 5 inches (0.381 mm) existed between the center to center distance between the rows. A coated area of about 0.25 inches (6.35 mm) by 0.25 inches (6.35 mm) was created, however, it contained cracks.

After formation of the eight rows, the process was stopped. The pulse setting was changed to 4 milliseconds; the pulse rate remained at 90 hertz (90 sec$^{-1}$); the laser average power was increased to 200 watts (200 J/sec) and the estimated spot diameter was increased to 0.25 inches (6.35 mm) at the work piece surface by changing the optical system. These changes lowered the power density to about 640 watts/cm$^2$ (640 J/sec-cm$^2$). The laser was directed at the solidified area for about 60 seconds. The portion of the solidified area exposed to the laser melted and then slowly solidified in an unconstrained manner upon removal of the laser, thereby eliminating cracking and continuing the underlying single crystal orientation of the work piece.

The sequence of 8 row formation followed by melting with a 0.25 inch diameter (6.35 mm) spot size laser was sequentially repeated 30 times, resulting in the continuation of the single crystal orientation of the work piece throughout the created layers.

Figure 7A:
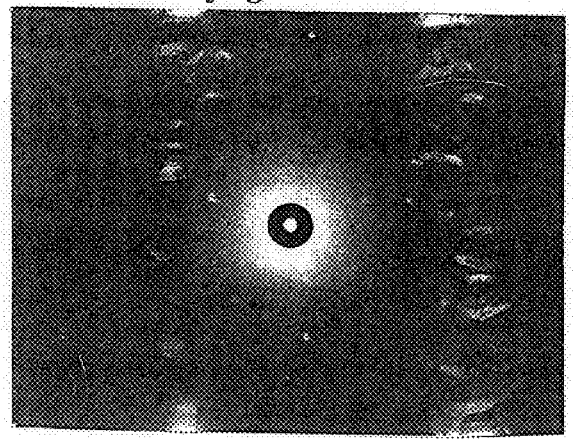
FIG. 7A shows an x-ray diffraction of point 1 denoting the crystallographic orientation of a build up of layers on a nickel base single crystal substrate.
Figure 7B:
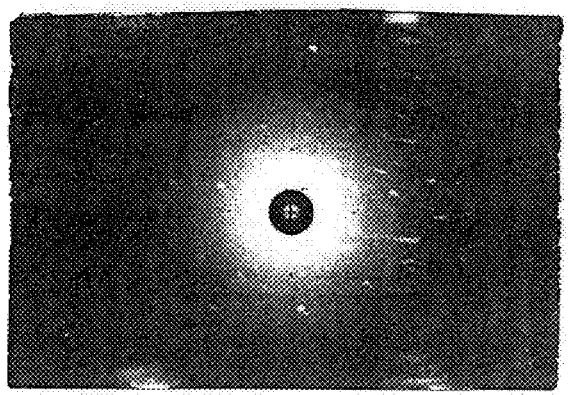
FIG. 7B shows an x-ray diffraction of point 2 denoting the crystallographic orientation of a build up of layers on a nickel base single crystal substrate.
Figure 7C:
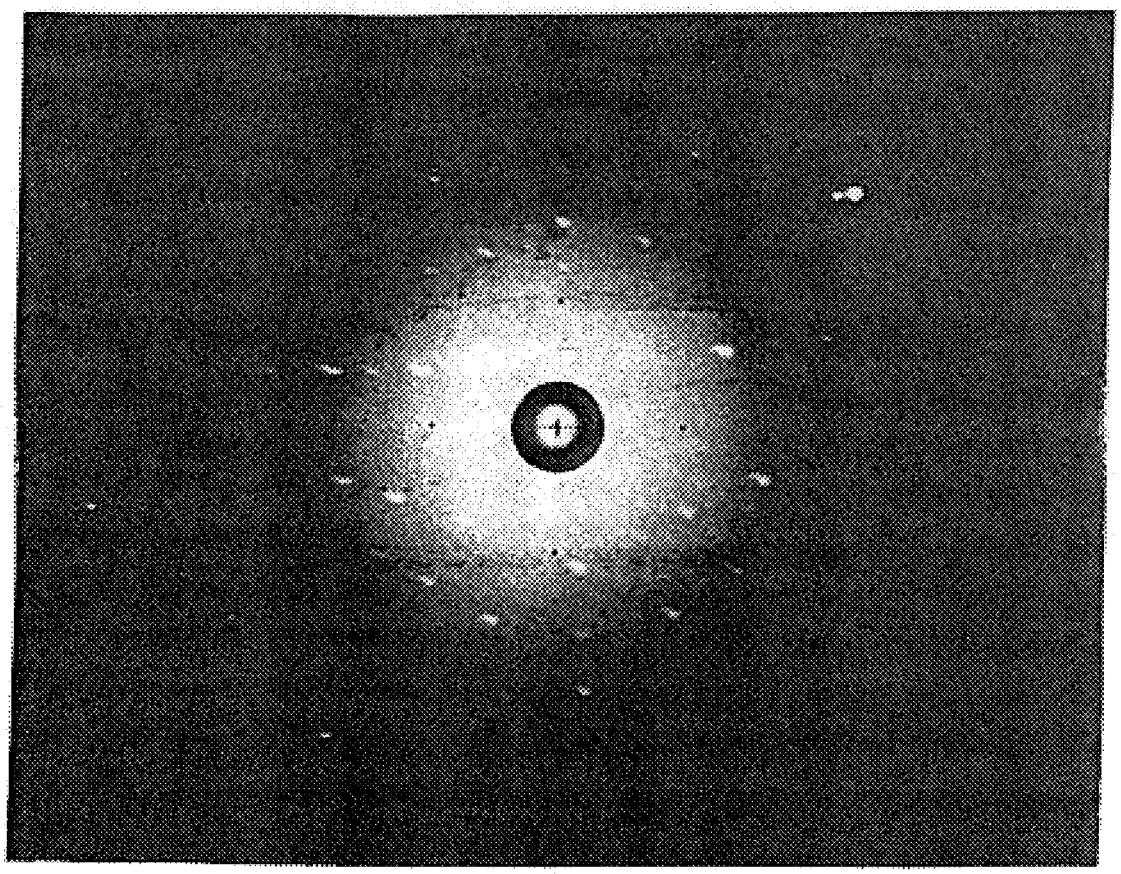
FIG. 7C shows an x-ray diffraction of point 3 denoting the crystallographic orientation of a build up of layers on a nickel base single crystal substrate.

X-ray diffractions were taken at various points on the build up to determine crystallographic orientation. FIG. 7A, FIG. 7B and FIG. 7C are x-ray diffractions which denote the crystallographic orientation of point 1 (taken near end of build up opposite substrate), point 2 (taken approximately at center of build up) and point 3 (taken in substrate region), respectively.

The difference in the crystallographic orientation of the points was less than about 5 degrees, thereby evincing the successful continuation of the single crystal orientation in the [100] direction throughout the build up. This alignment is further evinced by the visible horizontal lines on FIG. 7A, FIG. 7B and FIG. 7C which denote a similar crystallographic orientation.

EXAMPLE 2

Figure 8:
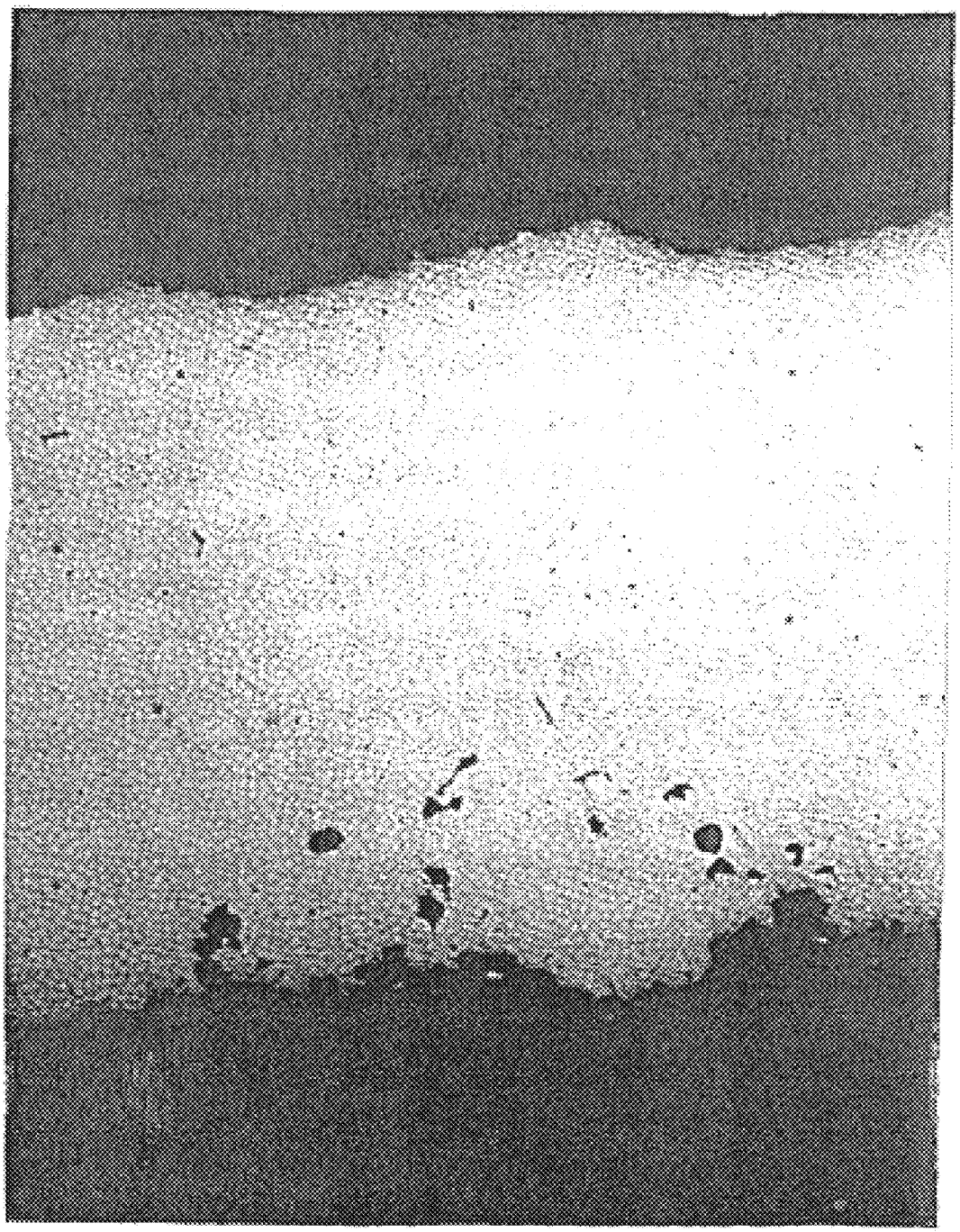
FIG. 8 shows a top view of a deposited structure, taken at 25 times normal magnification.

This trial utilized the same equipment, powder composition and substrate composition as described in Example 1. In this trial, material 0.5 inches (12.7 mm) in length and 8 rows in width, was deposited onto a substrate. As in Example 1, a space of about 0.15 inches (0.381 mm) existed between the center to center distance between the rows. FIG. 8 is a top view of the deposited structure at 25 times normal magnification showing the directional growth obtained by the deposition. As the deposited structure was formed, a YAG laser beam moved from one end of the deposited structure to the other.

The parameters of the trial were as follows. In the initial deposition phase, average laser power was about 100 watts (100 J/sec), pulse rate was 90 hertz (90 sec$^{-1}$) and pulse time was about 2 milliseconds. The power density was about $10^5$ watts/cm$^2$ (10 J/sec-cm$^2$). Beam spot diameter at the substrate surface was about 0.15 inches (0.381 mm).

In the remelting step, the pulse rate remained at 90 hertz (90 sec$^{-1}$); pulse time was about 4 milliseconds, average laser power was about 200 watts (200 J/sec) and the approximate spot diameter was increased to 0.25 inches (6.35 mm) at the work piece surface by changing the optical system. These changes lowered the power density to about 600 watts/cm$^2$ (600 J/sec-cm$^2$).

Figure 9:
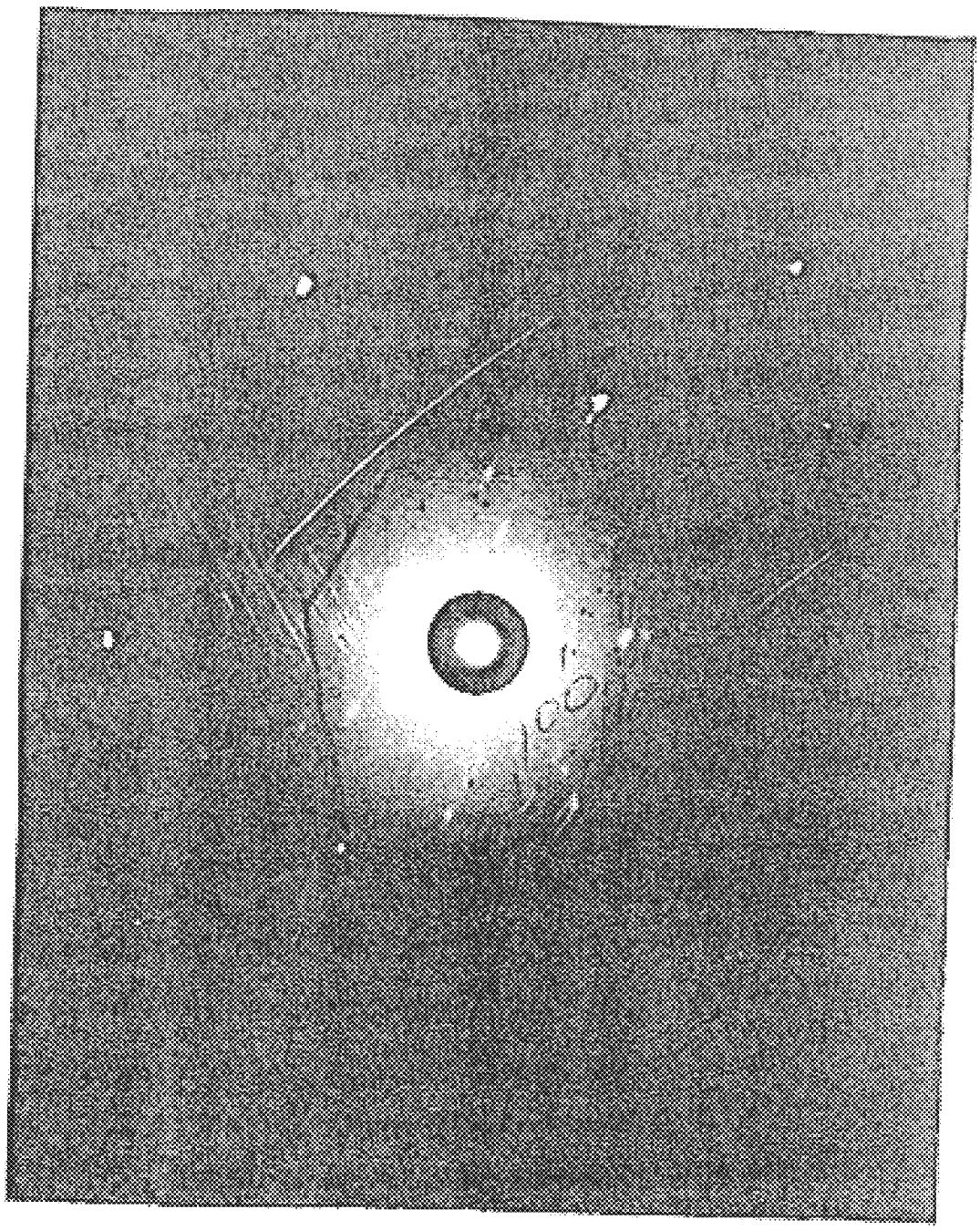
FIG. 9 shows the crystallographic orientation at the center of the deposited structure of FIG. 8.

This trial demonstrated the feasibility of depositing extended lengths of single crystal material. FIG. 9 shows alignment of the single crystal orientation in the [100] direction.

An advantage of the present invention is the ability to reduce material stresses transverse to the growth direction below an amount which causes cracking. This is accomplished by the novel second application of a heat source at a lower power density that melts the deposited layers which then directionally resolidify in an unconstrained manner at a lower rate. An unconstrained melt is not susceptible to hot tearing and subsequent stress cracking. Hot tearing is cracking that takes place in the partially molten state and is perceived as a major barrier in the production of crack free structures. Stress induced from the process after solidification is also reduced.

The present invention has demonstrated the feasibility of a novel containerless method of producing a single crystal gas turbine engine component. This is a significant technical advancement.

The present invention also has application in other related fields such as the creation of knife-edged seals which require a crack free deposit, as well as in the joining of metallic articles. The present invention is also useful in the field of rapid prototyping development.

The unique method of the present invention of melting a filler material into a metallic substrate under conditions chosen to eliminate cracking is readily distinguishable from the deposition process disclosed in U.S. Pat. No. 4,323,756 to Brown et al. entitled, *Method for Fabricating Articles by Sequential Layer Deposition*, assigned to the present Assignee and incorporated herein by reference. In the Brown deposition process, multiple thin layers of feed stock are deposited onto a substrate using a continuous energy beam. These thin layers are sequentially deposited on top of one another upon completion of each revolution of the deposition process.

Figure 10:
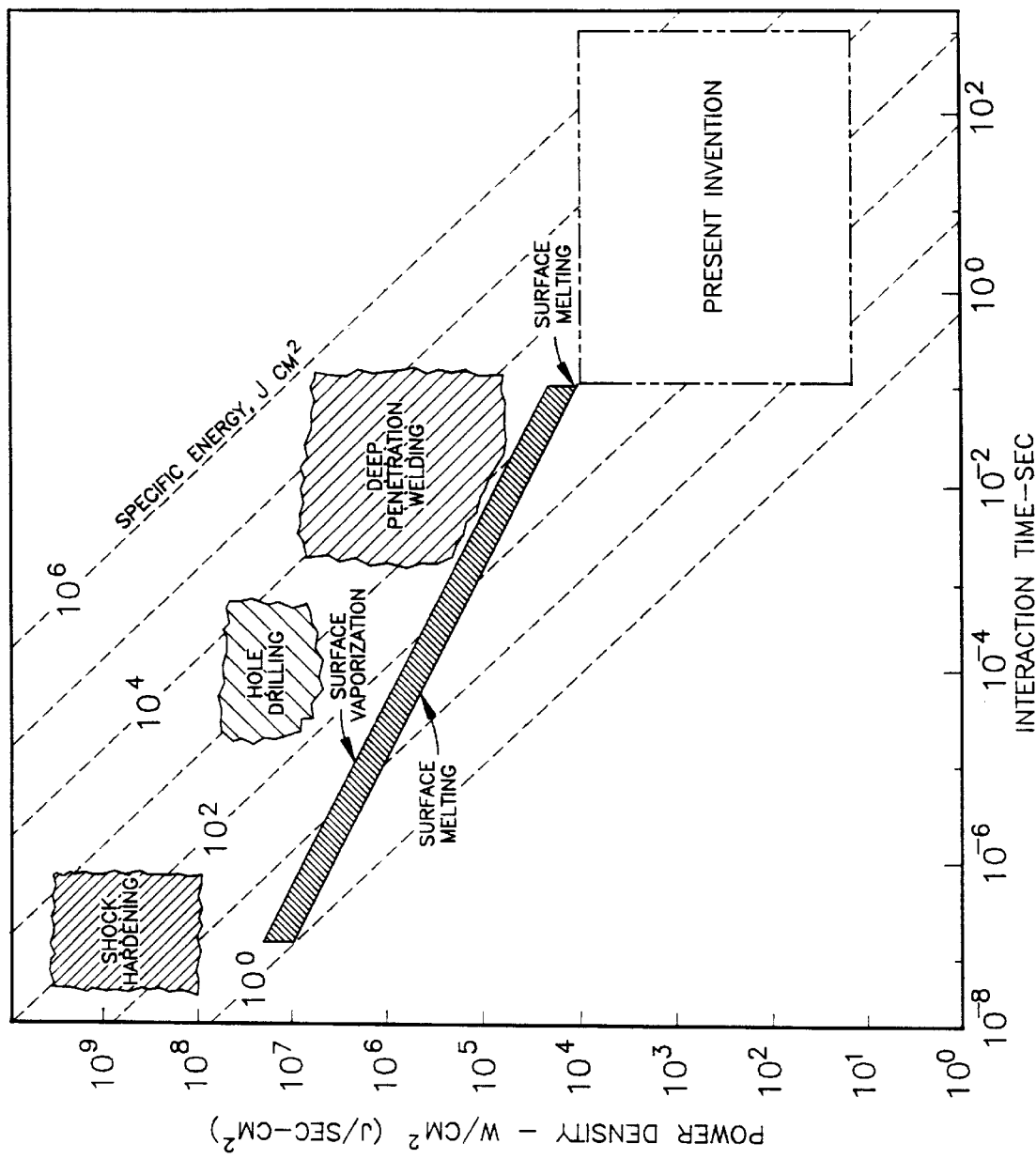
FIG. 10 shows the relationship between power density and time for an embodiment of the present invention as compared to a prior art process.

FIG. 10 shows the relationship between power density and time for the deposition process disclosed in the Brown patent as compared to the process of the present invention. The thin diagonal band on FIG. 10 represents the useful operating conditions for the invention disclosed in the Brown patent.

The useful operating conditions for the present intention, however, are distinct, as indicated on FIG. 10 where the approximate parameters for the one step embodiment as well as the approximate parameters for the embodiment including a subsequent remelt step are below the useful operating conditions described for the Brown process.

Figure 11:
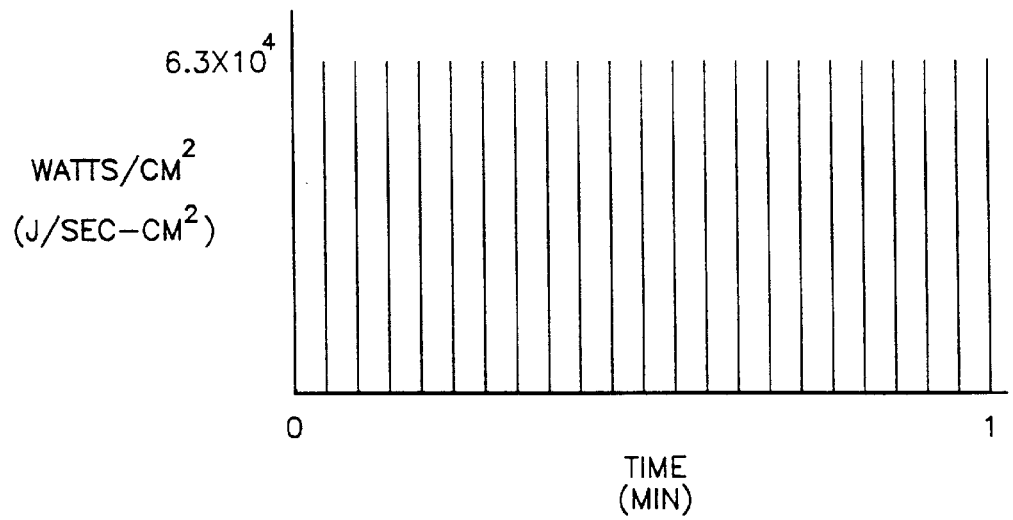
FIG. 11 shows a graphical representation of a prior art deposition process.
Figure 12:
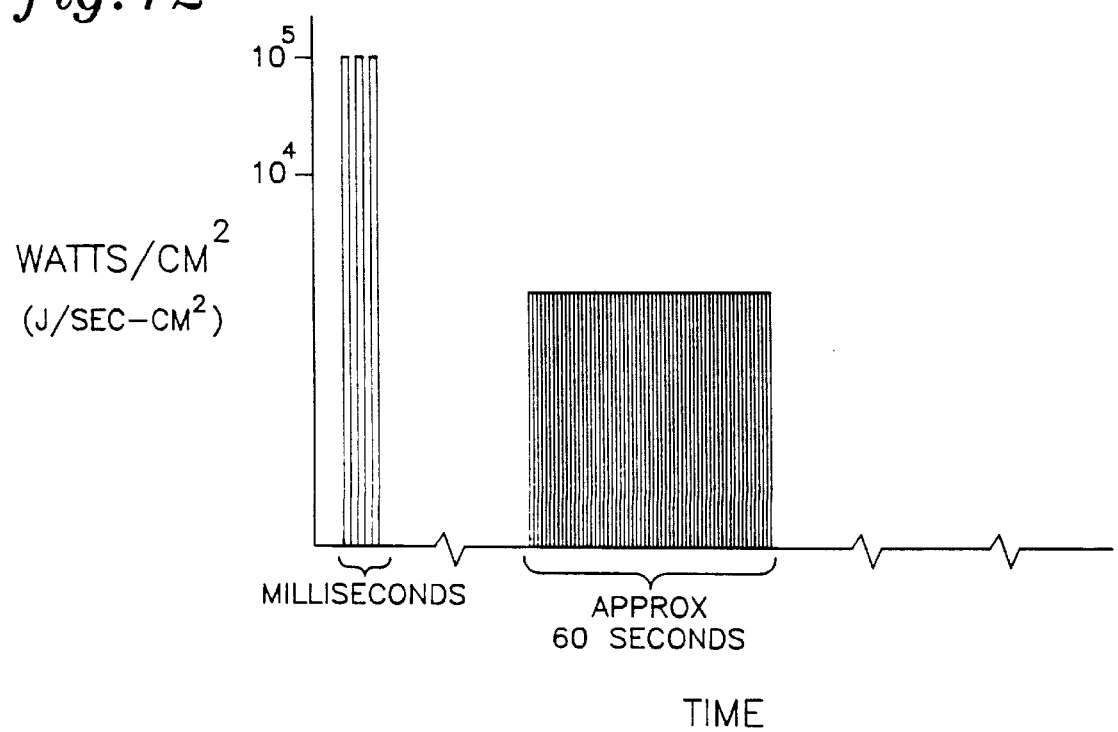
FIG. 12 shows a graphical representation of an embodiment of the present invention.

To further distinguish the present invention from the process disclosed in Brown, a bar graph comparison is presented in FIG. 11 and FIG. 12. In Example 2 of the Brown patent, multiple thin layer of feedstock are sequentially deposited on top of one another upon completion of each revolution. A continues energy source is employed. Referring now to FIG. 11, each vertical line represents a continuous revolution of deposited material. The mandrel rotated at 22 rpm and a fin of 1 inch in height was produced in 10 minutes (0.0454 inch height/revolution). As this deposition occurs, the power density remained approximately constant.

However, in an embodiment of the present invention, and as described in Example 1, a deposit is created by directing an energy source to create a molten pool and depositing material into the molten pool. Several deposits may be formed in the aforementioned manner. Each deposit may take about 1–2 milliseconds to form. Upon removal of the energy source, solidification occurs. The first set of vertical bars on FIG. 12 denote this deposition.

The deposit(s) is then exposed to lower power density (about 600 J/sec-cm$^2$) for a longer time (approximately 60 seconds). This extended exposure is shown on FIG. 12 also. Upon removal of the energy source, solidification occurs at a much slower rate than previously.

It is known that cooling rate (°c/s) is determined by the product of thermal gradient and growth rate. Although exact values are difficult to measure, reducing the cooling rate results in desirable from a crack reduction standpoint. The present invention achieves this important result of reduction in cooling rate and thermal gradient, which in turn reduces the solidification rate. This reduces the stresses induced during solidification. By reducing the shrinkage stresses of solidification in this manner, the propensity for crack formation is essentially eliminated.

Another benefit of the present invention is the ability to achieve unidirectional solidification. By reducing the thermal gradient, the growth direction is controlled by the crystallographic orientation of the substrate.

In addition, the microstructures created according to the invention are about one order of magnitude finer than those found in conventional castings. Nickel base superalloys, in cast form, generally have a dendrite microstructure. Dendrites are microscopic tree-like features which form during solidification and have a slightly different composition than the composition of the structure between the dendrites.

Dendrite spacing has some effect upon mechanical properties and upon the heat treatment required to achieve certain properties. For a given composition, dendrite spacing is a function of solidification rate and dendrite spacing is used to estimate cooling rates.

In the present invention, even though steps are taken to reduce the cooling rates of the melted material from that which occurs in prior art laser processes, the cooling rates are still substantially greater than those which the superalloy material undergoes during normal casting. For conventionally cast superalloys, primary dendrite spacing will range from about 200 microns to about 600 microns. For material deposited by the present invention, dendrite spacing may range from about 20 microns to about 180 microns.

Although the invention has been shown and described with respect to detailed embodiments thereof, it should be understood by those skilled in the art that various changes in form and detail may be made without departing from the spirit and scope of the invention.

What is claimed is:

1. A single crystal metallic article made with the use of an energy source, the method comprising melting a filler material into a single crystal metallic substrate having a single crystal structure under conditions chosen to eliminate cracking, namely low power density between about 10 watts/cm$^2$ and about 10$^4$ watts/cm$^2$, and at a relatively large diameter between about 0.1 inches and about 4 inches, for an extended length of time between about 0.1 seconds and about 1000 seconds to produce a molten pool with a low aspect ratio, wherein the single crystal structure of the substrate is continued throughout the article to produce a crack free article having a dendrite spacing between about 20 microns and about 180 microns.

2. The single crystal metallic article of claim 1 wherein the article is a single crystal gas turbine engine component.

3. The single crystal metallic article of claim 1 wherein the article is a knife-edged seal.

4. The single crystal metallic article of claim 1 wherein the filler material has the same composition as the substrates.

5. The single crystal metallic article of claim 1 wherein the filler material for a select portion of the article is enriched with a material selected from the group consisting of Al, Cr, Y, La, Ce and mixtures thereof.

6. The single crystal metallic article of claim 1 wherein the filler material for a select portion of the article is enriched with a material selected from the group consisting of Ti, Ta, Cb, Mo and W.

7. The single crystal metallic article of claim 1, wherein the article has a variance in crystallographic orientation less than about 5 degrees.

8. The single crystal metallic article of claim 1, wherein said article is a superalloy article.

9. The single crystal metallic article of claim 1, wherein said article is a nickel base or cobalt base superalloy article.

10. The single crystal metallic article of claim 1, wherein said article is susceptible to cracking during laser metal processing.

11. A metallic article of near-net shape made with the use of an energy source, the method comprising the steps of:
  (a) melting a portion of a substrate with an energy source, thereby creating a molten portion;
  (b) depositing metallic material in the molten portion, and allowing the molten portion to rapidly solidify to form a deposit; and
  (c) remelting the deposit and a portion of adjacent article under conditions of a lower power density and a longer exposure time than that for the energy source in step (a), whereupon slow solidification occurs without cracking to produce a crack free metallic article of near-net shape having a dendrite spacing between about 20 and about 180 microns.

12. The metallic article of claim 11 wherein the article is a single crystal gas turbine engine component.

13. The metallic article of claim 11 wherein the article is a knife-edged seal.

14. The metallic article of claim 11 wherein the filler material has the same composition as the substrate.

15. The metallic article of claim 11 wherein the filler material for a select portion of the article is enriched with a material selected from the group consisting of Al, Cr, Y, La, Ce and mixtures thereof.

16. The metallic article of claim 11 wherein the filler material for a select portion of the article is enriched with a material selected from the group consisting of Ti, Ta, Cb, Mo and W.

17. The metallic article of claim 11 wherein the method of producing the article further comprises creating a three dimensional computer model of a single crystal article to be produced, such that incremental layers define individual cross sections to be produced, whereby the model is used by a computer to guide a five-axis part positioning system, and the energy source for production of horizontal features along a vertical axis.

18. The metallic article of claim 11, wherein the article has a variance in crystallographic orientation less than about 5 degrees.

19. The metallic article of claim 11, wherein said article is a superalloy article.

20. The metallic article of claim 11, wherein said article is a nickel base or cobalt base superalloy article.

21. A single crystal gas turbine engine metallic component made with the use of an energy source, the method comprising the steps of:
  (a) directing an energy source at a single crystal metallic substrate having a crystallographic orientation to melt a portion of the substrate and form a pool;
  (b) depositing metallic material into the pool, wherein the metallic material rapidly solidifies and forms a deposit;
  (c) forming a plurality of deposits; and
  (d) directing the energy source at the deposits for a longer exposure time and at a lower power density than used in step (a), wherein solidification occurs at a slower rate than step (b) to reduce thermal stresses and eliminate cracking, thereby continuing the crystallographic orientation of the metallic substrate, wherein the component has a dendrite spacing between about 20 microns and about 180 microns.

22. The single crystal gas turbine engine component of claim 21, wherein the article has a variance in crystallographic orientation less than about 5 degrees.

23. The single crystal gas turbine engine metallic component of claim 16, wherein said component is a superalloy component.

24. The single crystal gas turbine engine metallic component of claim 21, wherein said component is a nickel base or cobalt base superalloy component.

25. A single crystal metallic article having a dendrite spacing between about 20 microns and about 180 microns.

26. The article of claim 25 wherein the article is a gas turbine engine blade.

27. The article of claim 25 wherein the article is a knife-edged seal.

28. The single crystal metallic article of claim 25, wherein said article is a superalloy article.

29. The single crystal metallic article of claim 25, wherein said article is a nickel base or cobalt base superalloy article.

30. A single crystal metallic article made by a method comprising melting a filler material into a single crystal metallic substrate having a single crystal structure using a low power density energy source between about 10 watts/cm$^2$ and about 10$^4$ watts/cm$^2$ at a diameter greater than about 0.1 inches for a length of time greater than about 0.1 seconds to produce a molten pool with a low aspect ratio, wherein the single crystal structure of the substrate is continued throughout the article to produce a crack free article having a dendrite spacing between about 20 microns and about 180 microns.

31. The single crystal metallic article of claim 30, wherein the article is a knife-edged seal.

32. The single crystal metallic article of claim 30, wherein the article is a single crystal gas turbine engine component.

33. The single crystal metallic article of claim 30, wherein the filler material has the same composition as the substrate.

34. The single crystal metallic article of claim 30, wherein said molten pool has a diameter greater than its depth.

35. The single crystal metallic article of claim 30, wherein the article has a variance in crystallographic orientation less than about 5 degrees.

36. The single crystal metallic article of claim 30, wherein the filler material is enriched with one or more elements selected from the group consisting of Al, Ti, Ta, Cb, Mo, W, Cr, Y, La or Ce.

37. The single crystal metallic article of claim 30, wherein the filler material is enriched with Cr.

38. The single crystal metallic article of claim 30, wherein the article is crack free.

39. The single crystal metallic article of claim 30, wherein the filler material contains a decreased amount of one or more elements selected from the group consisting of Al, Ti, Ta, Cb, Mo or W.

40. The single crystal metallic article of claim 30, wherein said article is a nickel base or cobalt base superalloy article.

41. The single crystal metallic article of claim 30, wherein said article is a superalloy article.

42. A metallic article made by a method comprising the steps of:

(a) melting a portion of a substrate with an energy source, thereby creating a molten portion;

(b) depositing metallic material in the molten portion and allowing the molten portion to solidify to form a solidified deposit; and (c) remelting the solidified deposit and a portion of adjacent article under conditions of a lower power density and a longer exposure time than that for the energy source in step (a), whereupon slow solidification occurs without cracking to produce a crack free metallic article of near-net shape having a dendrite spacing between about 20 and about 180 microns.

43. The metallic article of claim 42, wherein the article has a variance in crystallographic orientation less than about 5 degrees.

44. The metallic article of claim 42, wherein said article is a superalloy article.

45. The metallic article of claim 42, wherein said article is a nickel base or cobalt base superalloy article.

* * * * *